(12) United States Patent
Nakajima

(10) Patent No.: US 6,369,649 B2
(45) Date of Patent: Apr. 9, 2002

(54) TRANSMISSION POWER AMPLIFICATION METHOD AND APPARATUS

(75) Inventor: Toshikazu Nakajima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/899,987

(22) Filed: Jul. 9, 2001

(30) Foreign Application Priority Data

Jul. 12, 2000 (JP) ........................................ 2000-210655

(51) Int. Cl.$^7$ .............................. H03F 1/14; H03F 1/00; H03G 9/00; H03G 3/10
(52) U.S. Cl. ..................... 330/51; 330/133; 330/151; 330/285
(58) Field of Search ..................... 330/51, 133, 134, 330/151, 285

(56) References Cited

U.S. PATENT DOCUMENTS

| | | | | |
|---|---|---|---|---|
| 5,661,434 A | * | 8/1997 | Brozovich et al | 330/51 |
| 5,909,643 A | * | 6/1999 | Aihara | 330/51 |
| 6,107,878 A | * | 8/2000 | Black | 330/133 |
| 6,172,559 B1 | * | 1/2001 | Yamaguchi | 330/51 |
| 6,265,935 B1 | * | 7/2001 | Kaneda et al. | 330/51 |

FOREIGN PATENT DOCUMENTS

| | | |
|---|---|---|
| EP | 0 818 880 A2 | 1/1998 |
| JP | 10-294626 | 11/1998 |
| WO | WO 99/31799 A1 | 6/1999 |

* cited by examiner

Primary Examiner—Robert Pascal
Assistant Examiner—Patricia T. Nguyen
(74) Attorney, Agent, or Firm—Sughrue Mion, PLLC

(57) ABSTRACT

A transmission power amplification apparatus includes a first automatic gain control section, second automatic gain control section, power amplifier, and control section. The first automatic gain control section amplifies an input signal. The second automatic gain control section amplifies an output from the first automatic gain control section. The power amplifier nonlinearly amplifies an output from the second automatic gain control section and outputs a transmission signal. The control section controls amplification of the input signal by using the synthetic gain of the first and second automatic gain control sections and the power amplifier in the transmission power range from a maximum value to an intermediate value, and controls amplification of the input signal by using only the gain of the first automatic gain control section in the transmission power range from the intermediate value to a minimum value. The second automatic gain control section has a gain characteristic that corrects nonlinearity of the power amplifier 102. A transmission power amplification method is also disclosed.

10 Claims, 6 Drawing Sheets

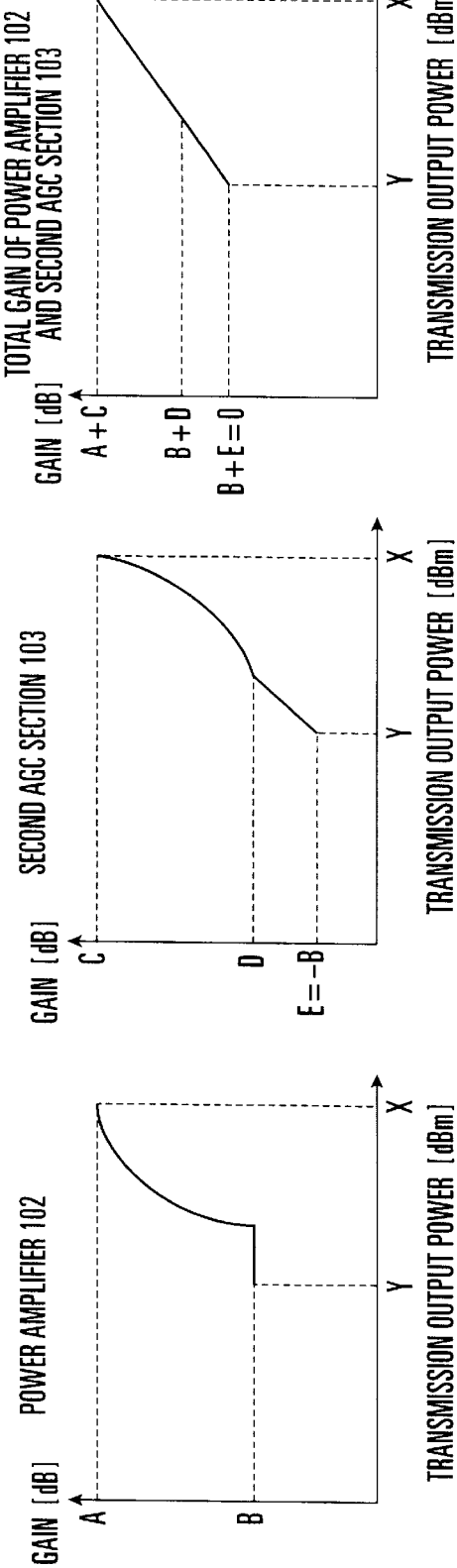
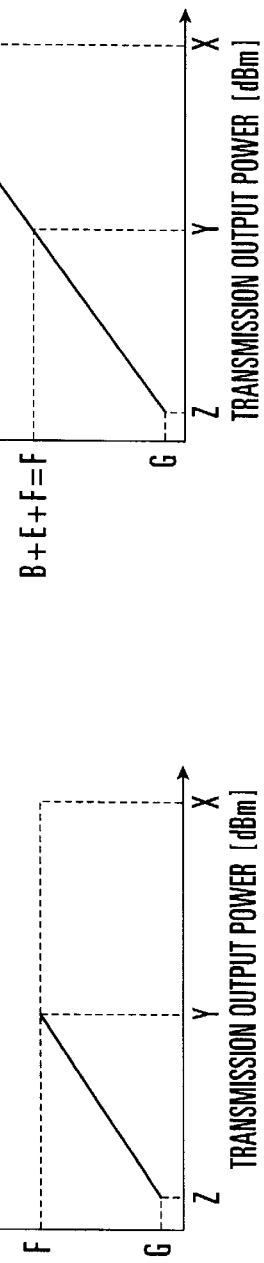
FIG.4A  FIG.4B  FIG.4C  FIG.4D  FIG.4E

TRANSMISSION POWER AMPLIFICATION METHOD AND APPARATUS

BACKGROUND OF THE INVENTION

The present invention relates to a transmission power amplification method and apparatus which realize transmission power control suitable for a case where a transmission power amplification section includes a nonlinear gain amplifier.

In a recent digital mobile communication system, a next-generation portable telephone scheme based on a W-CDMA (Wideband-Code Division Multiple Access) scheme using a spread spectrum scheme has proceeded toward commercialization in order to further improve the frequency usage efficiency. According to the W-CDMA scheme, to solve the so-called near-far problem, a dynamic range of 70-odd dB or more needs to be quickly changed with high precision in transmission power control.

Even if the use of a Class-A or Class-B power amplifier used in a transmission power amplification section is limited to an operating point at which the amplifier exhibits excellent linearity, transmission is not frequency performed at the maximum output in practice, and power is always consumed even in the low-transmission output mode owing to DC bias currents. Demands have therefore arisen for improvements in the power conversion efficiency of these nonlinear gain amplifiers.

As means for improving the power conversion efficiency of a nonlinear gain amplifier using an FET (Field Effect Transistor) element, a bias control method, a method of bypassing a nonlinear gain amplifier by using a switch, and the like are available. FIG. 5 shows the relationship between the transmission output of a nonlinear gain amplifier and the power conversion efficiency in a case where the drain voltage is so controlled as to optimize the power conversion efficiency in consideration of the operation stability of the nonlinear gain amplifier. As shown in FIG. 5, the power conversion efficiency greatly improves when the drain voltage is controlled as compared with a case where the drain voltage is not controlled.

If, however, the drain voltage is low, the linearity of the nonlinear gain amplifier deteriorates, and its operation becomes unstable. When a nonlinear gain amplifier is to be bypassed by using a switch, the power consumption of the nonlinear gain amplifier can be reduced to zero by turning off the power supply of the nonlinear gain amplifier. However, the transmission output level becomes discontinuous in switching operation.

Japanese Patent Laid-Open No. 10-294626 (reference 1) discloses a gain controller for reducing discontinuous portions of the transmission output level by bypassing the nonlinear gain amplifier using a switch. FIG. 6 shows a gain controller disclosed in reference 1. Referring to FIG. 6, a signal input from an input terminal 501 is branched into two paths by a distributor 510 and respectively input to first and second variable gain amplifiers 516. An output from the first variable gain amplifier 511 is amplified by a linear power amplifier 514 through a filter 512 and driver amplifier 513. The resultant signal is output to a synthesizer 515.

The synthesizer 515 synthesizes the output from the second variable gain amplifier 516 with the output from the linear power amplifier 514. The resultant signal is output from an output terminal 502. A voltage from a power supply 503 is applied to the linear power amplifier 514, driver amplifier 513, and first variable gain amplifier 511 through a switch circuit 518. A control circuit 517 controls the first variable gain amplifier 511, second variable gain amplifier 516, and switch circuit 518.

The operation of the gain controller having the above arrangement will be briefly described next. If a desired transmission output is high, the gains of the first and second variable gain amplifiers 516 are set to be large and small, respectively. In this case, a main signal is transmitted through a first path formed by the first variable gain amplifier 511. If a desired transmission output low, a main signal is transmitted through a second path formed by the second variable gain amplifier 516.

When the gain level of the first variable gain amplifier 511 becomes sufficiently lower than that of the second path, the switch circuit 518 is switched to turn off the power supply for the first variable gain amplifier 511, driver amplifier 513, and linear power amplifier 514, thereby suppressing their current consumption to 0.

That is, two parallel paths are independently gain-controlled such that a route exhibiting an optimal power efficiency is selected in accordance with a required transmission output level, and the gains of the respective paths are continuously switched/controlled to reduce discontinuity.

In the above conventional gain controller, however, when outputs from the first and second paths are to be synthesized, since the first and second paths are connected in parallel, the gain values of the respective paths which are required to obtain a desired transmission output level cannot be obtained by simply adding the gain of the first path to the gain of the second path. That is, the levels of the respective paths must be inversely calculated such that the level after synthesis becomes the desired transmission output level, and the necessary gains of the respective paths must be calculated from the inversely calculated levels.

In a digital mobile communication system in which transmission power must be variably controlled with high precision at high speed with respect to an ambient radio environment that changes incessantly in order to cover a wide dynamic range, a complicated algorithm is required for transmission power control, and much time is required for processing.

SUMMARY OF THE INVENTION

It is an object of the present invention to provide a transmission power amplification method and apparatus which can ensure an optimal power conversion efficiency and linearity in obtaining a desired transmission power.

In order to achieve the above object, according to the present invention, there is provided an transmission power amplification apparatus comprising first variable gain amplification means for amplifying an input signal, second variable gain amplification means for amplifying an output from the first variable gain amplification means, nonlinear gain amplification means for nonlinearly amplifying an output from the second variable gain amplification means and outputting a transmission signal, and control means for controlling amplification of the input signal by using the synthetic gain of the first and second variable gain amplification means and the nonlinear gain amplification means in a transmission power range from a maximum value to an intermediate value, and controlling amplification of the input signal by using only the gain of the first variable gain amplification means in a transmission power range from the intermediate value to a minimum value, wherein the second variable gain amplification means has a gain characteristic that corrects nonlinearity of the nonlinear gain amplification means.

BRIEF DESCRIPTION OF THE DRAWINGS

FIGS. 4A to 4E are graphs respectively showing the relationships between the gain of the power amplifier in FIG. 1 and the transmission output power, between the gain of the second AGC section and the transmission output power, between the total gain of the power amplifier and second AGC section and the transmission output power, between the gain of the first AGC section and the transmission output power, and between the total gain of the power amplifier and the first and second AGC sections and the transmission output power;

DESCRIPTION OF THE PREFERRED EMBODIMENT

The present invention will be described in detail below with reference to the accompanying drawings.

Figure 1:
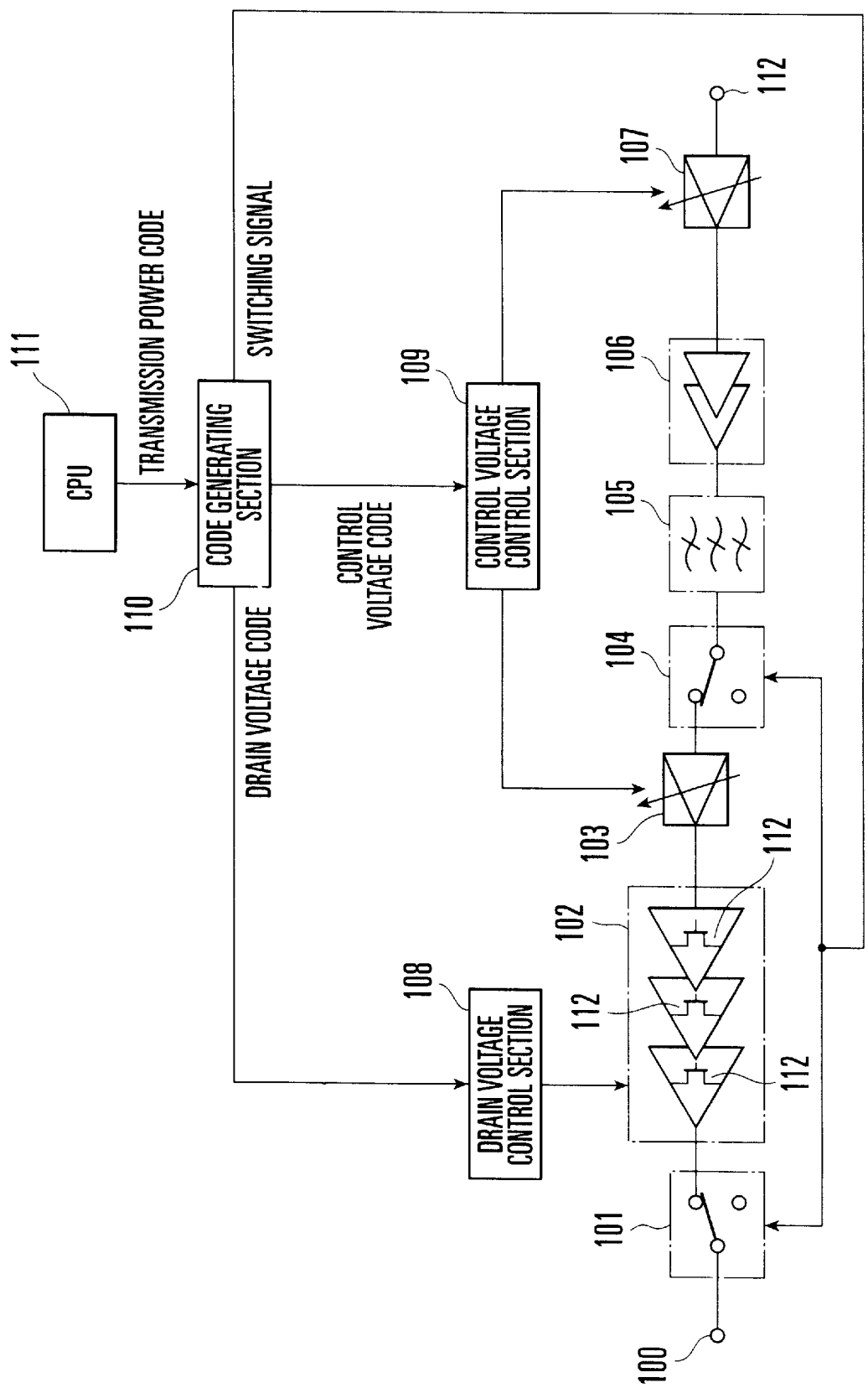
FIG. 1 is a block diagram showing a transmission power amplification apparatus according to an embodiment of the present invention.

FIG. 1 shows a transmission power amplification apparatus according to an embodiment of the present invention. Referring to FIG. 1, the level of a signal input from an input terminal 112 is adjusted by a first automatic gain control (AGC) section 107. The resultant signal is amplified by a driver amplifier 106. A band-pass filter (BPF) 105 removes unnecessary spurious components such as harmonic components produced by the driver amplifier 106 from the output from the driver amplifier 106. The level of this signal is then adjusted by a second AGC section 103. The output from the second AGC section 103 is amplified to a desired transmission output level by a nonlinear gain amplifier 102. The resultant signal is output to an antenna terminal 100. The gain amplifier 102 is formed by a power amplifier 102 including FETs 112.

Path switches 101 and 104 are respectively connected to the output stage of the power amplifier 102 and the input stage of the second AGC section 103. By interlocking and switching the path switches 101 and 104, the first route in which the second AGC section 103 and power amplifier 102 are cascaded is bypassed, and the output from the BPF 105 is directly output to the antenna terminal 100 through a second route as a bypass route.

The transmission power amplification apparatus of this embodiment further includes a drain voltage control section 108 to improve the power conversion efficiency of the power amplifier 102. The drain voltage control section 108 is mainly formed by a DC/DC (Direction Current/Direction Current) converter and controls the drain voltages of the FETs 112 forming the power amplifier 102 on the basis of the drain voltage code generated by a code generating section 110.

A control voltage control section 109 for controlling the gains of the first and second AGC sections 107 and 103 is comprised of a DSP (Digital Signal Processor), D/A (Digital to Analog) converter, and the like. The control voltage control section 109 converts the control voltage code output from the code generating section 110 into control voltage values for the first and second AGC sections 107 and 103.

The path switches 101 and 104 are interlocked/controlled by switching signals output from the code generating section 110 to perform path switching for transmission signals. The code generating section 110 is controlled by a transmission power code from a CPU (Central Processing Unit) 111 to output a switching signal.

The operation of the transmission power amplification apparatus having the above arrangement will be described next with reference to FIGS. 2 to 4.

Figure 2:
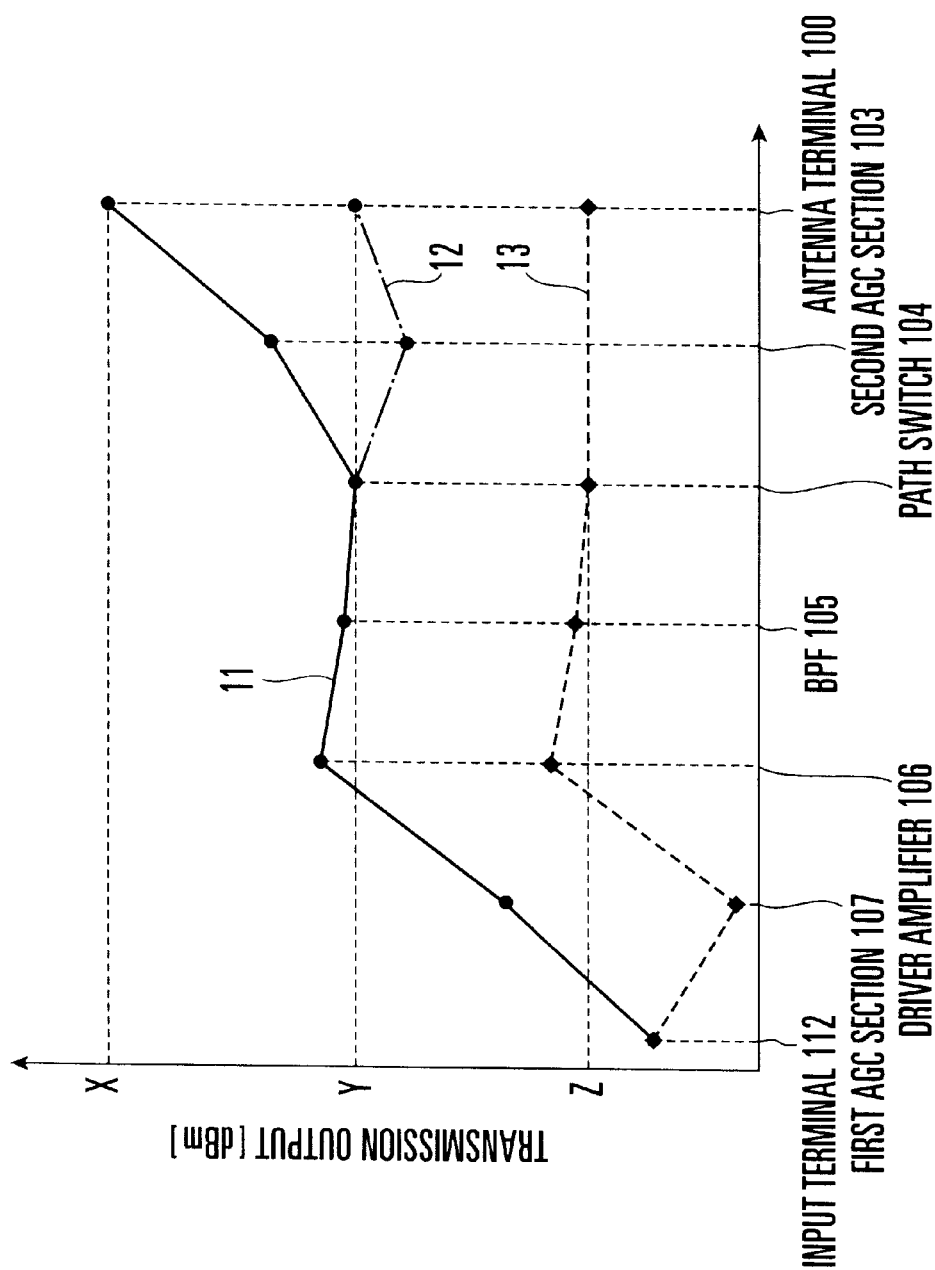
FIG. 2 is a level diagram of each block of the transmission power amplification apparatus in FIG. 1.

FIG. 2 shows the level diagrams of transmission outputs from the respective blocks from the input terminal 112 to the antenna terminal 100 in FIG. 1. Referring to FIG. 2, a characteristic 11 represents the level diagram obtained when the transmission output power from the antenna terminal 100 is a maximum value (Xdbm); a characteristic 12, the level diagram obtained when the transmission output power ranges from the maximum value to an intermediate value (Xdbm to Ydbm); and a characteristic 13, the level diagram obtained when the transmission output power is a minimum value (Zdbm).

Figure 3:
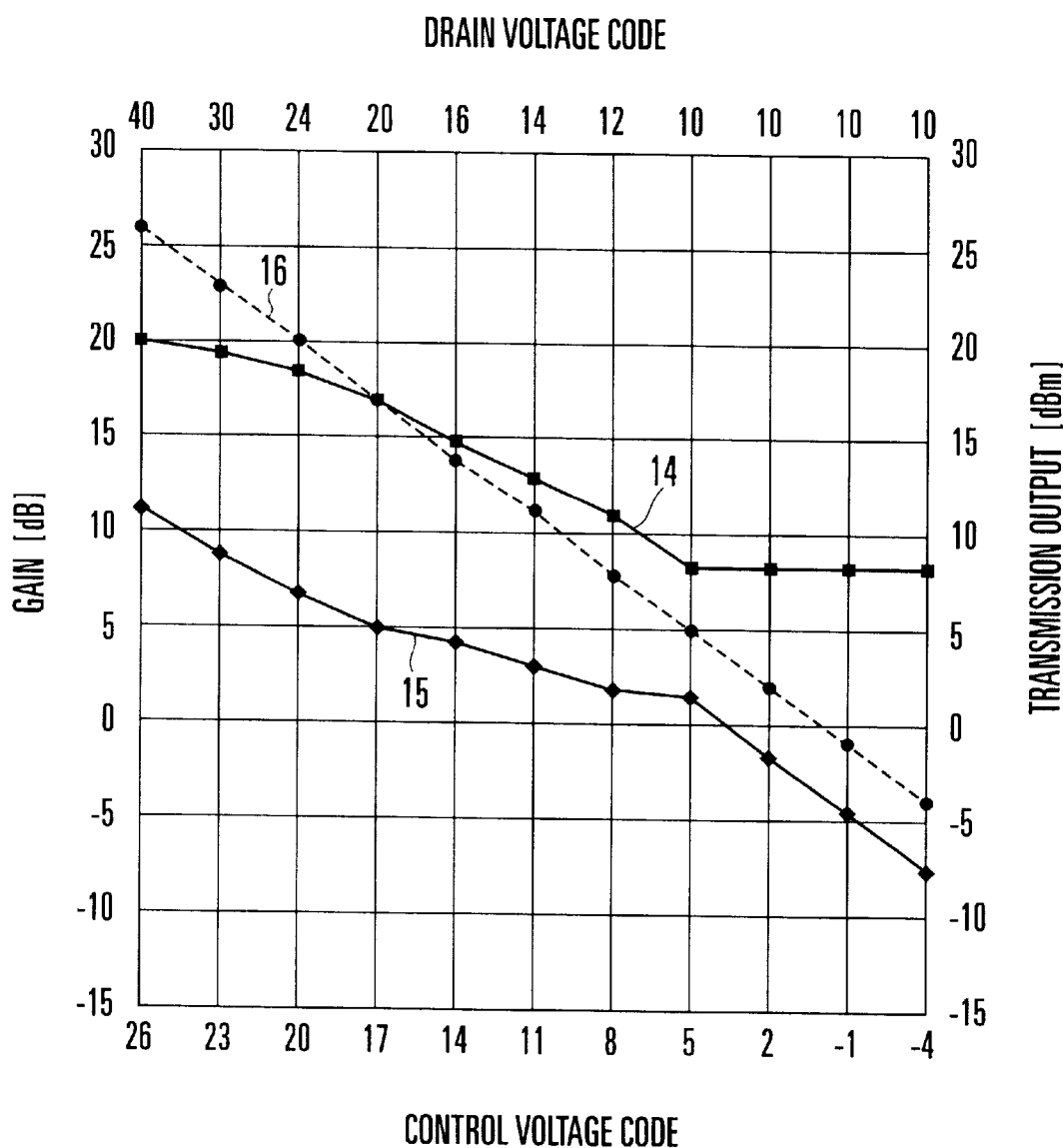
FIG. 3 is a graph showing the relationship between the gain of a power amplifier and the gain of a second AGC section in FIG. 1.
Figure 5:
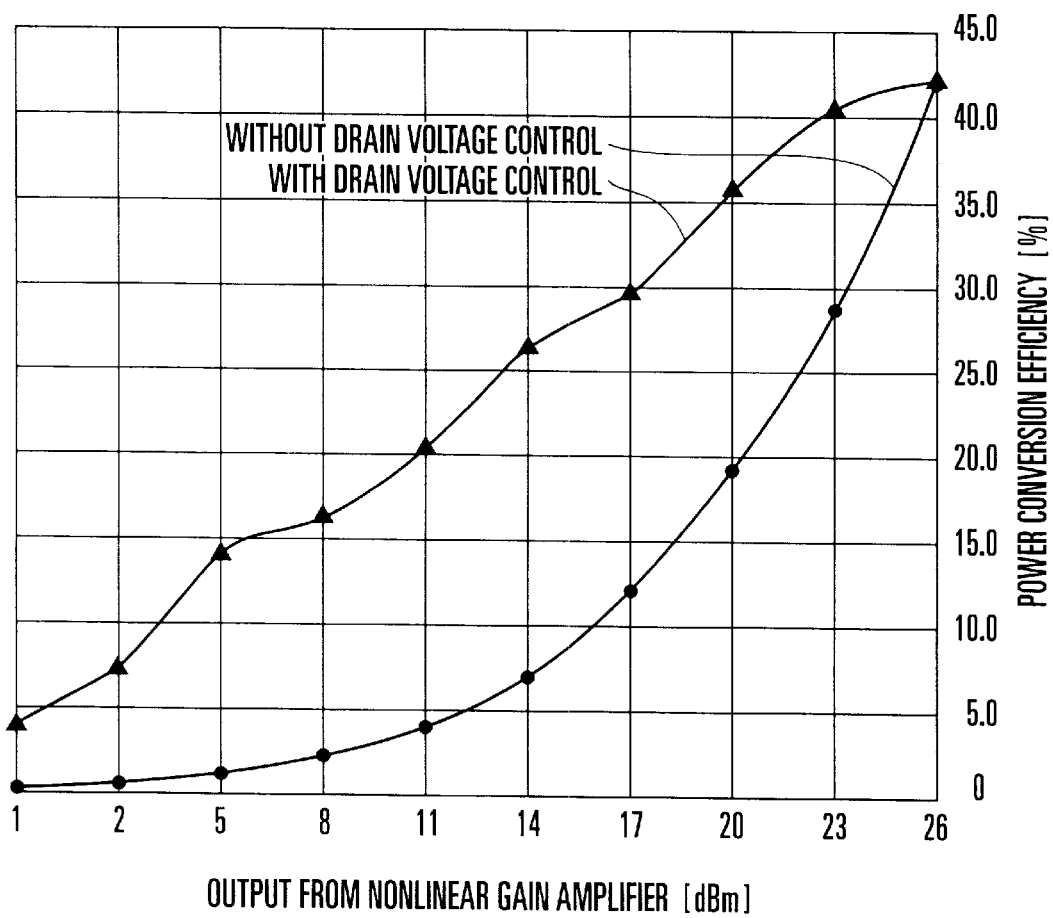
FIG. 5 is a graph showing the relationship between an output from a nonlinear gain amplifier and power conversion efficiency.
Figure 6:
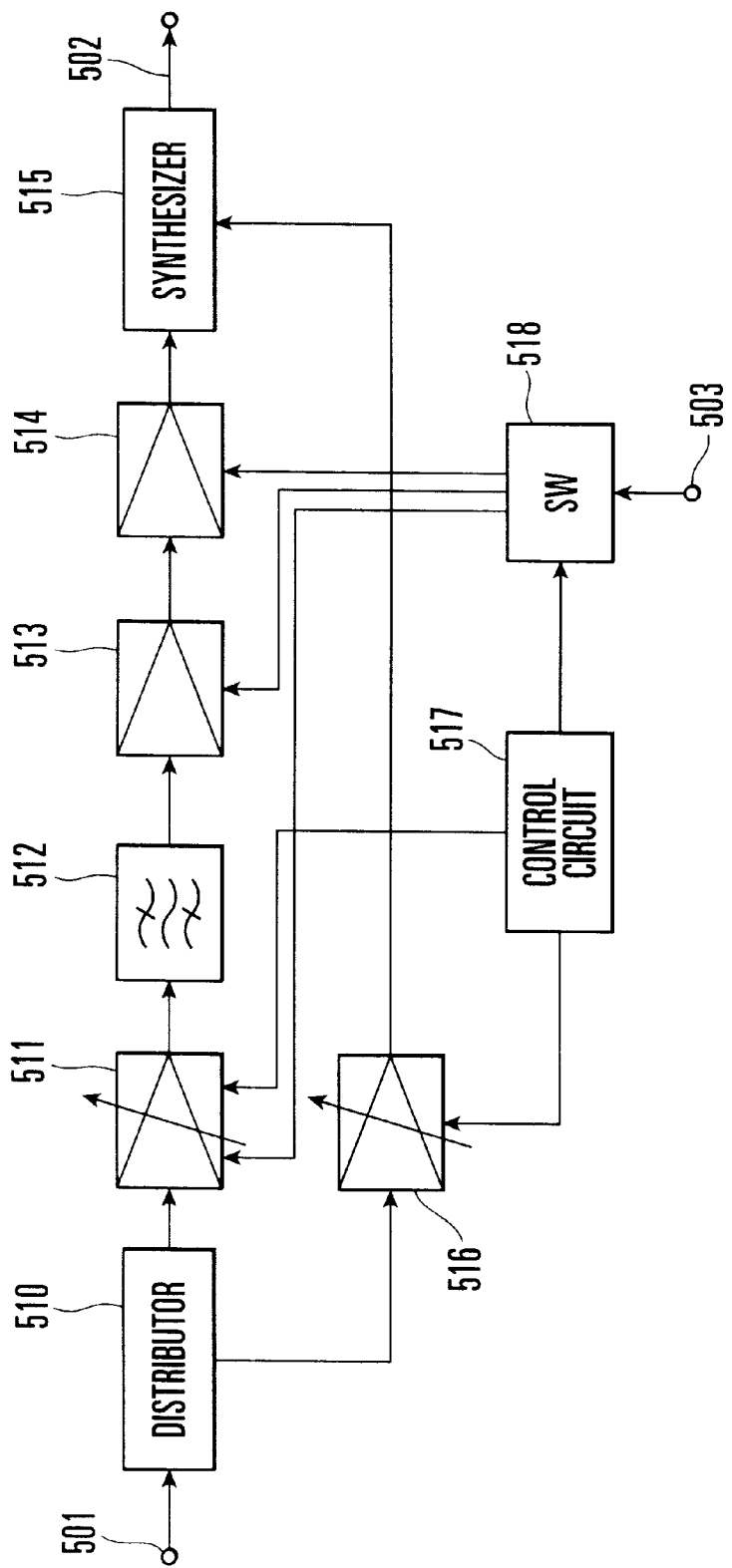
FIG. 6 is a block diagram showing a conventional transmission power amplification apparatus.

Referring to FIG. 3, a characteristic 14 represents the relationship between the gain of the power amplifier 102 and the drain voltage code output from the code generating section 110 on the basis of a transmission power code from the CPU 111; a characteristic 15, the relationship between the control voltage code output from the code generating section 110 and the gain of the second AGC section 103; and 16, the sum of these two relationships, i.e., a transmission output from the first route passing through the second AGC section 103 and power amplifier 102.

The drain voltage code output from the code generating section 110 is a value set in advance in accordance with the drain voltage value of the power amplifier 102. The control voltage code output from the code generating section 110 is a value set in advance in accordance with the gain of the second AGC section 103. As the values represented by these codes decrease, the voltage value and gain also decrease.

FIGS. 4A to 4E show the gain values that the respective blocks can take when the transmission output power at the antenna terminal 100 changes to Xdbm, Ydbm, and Zdbm.

When the desired transmission output at the antenna terminal 100 is the maximum value, the code generating section 110 sends a switching signal to the path switches 101 and 104 on the basis of a transmission power code from the CPU 111. With this operation, the path switches 101 and 104 are switched to set the first route passing through the second AGC section 103 and power amplifier 102.

At the same time, the code generating section 110 outputs a drain voltage code to the drain voltage control section 108 on the basis of a transmission power code from the CPU 111, and also outputs a control voltage code to the control voltage control section 109. The drain voltage control section 108 controls the drain voltage value to maximize the power conversion efficiency of the power amplifier 102. The control voltage control section 109 sets a control voltage value to maximize the gains of the second AGC section 103 and first AGC section 107 in accordance with the control voltage code. As a consequence, a level diagram like that indicated by the characteristic 11 in FIG. 2 is obtained.

This state will be described with reference to FIGS. 4A to 4E. As shown in FIGS. 4A, 4B, and 4D, when the transmission output power at the antenna terminal 100 is XdBm, the gains of the power amplifier 102, second AGC section 103, and first AGC section 107 are respectively set to maximum values AdB, CdB, and FdB. As shown in FIG. 4E, therefore, the transmission output power XdBm is obtained in accordance with the total gain (A+C+F) dB.

If the desired transmission output at the antenna terminal 100 falls with the range from the maximum value to the intermediate value, the path switches 101a and 104 maintain the state where the first route passing through the second AGC section 103 and power amplifier 102 is selected with the switching signal output from the code generating section 110 on the basis of a transmission power code from the CPU 111.

At the same time, the code generating section 110 outputs a drain voltage code and control voltage code to the drain voltage control section 108 and control voltage control section 109, respectively, on the basis of a transmission power code from the CPU 111. At this time, the gain of the first AGC section 107 is maintained maximum owing to the setting of a control voltage value. For this reason, as indicated by the characteristic 11 in FIG. 2, the same level diagram as that obtained when the transmission output is the maximum value appears until a signal is output from the path switch 104.

To obtain a desired transmission output at the antenna terminal 100, therefore, the gains of the second AGC section 103 and power amplifier 102 must be adjusted respectively. The gain of the power amplifier 102 is adjusted while the power conversion efficiency is maintained. As indicated by the characteristic 14 in FIG. 3, however, if the drain voltage code is decreased, the linearity of the gain of the power amplifier 102 is impaired.

Control voltage values for the control voltage control section 109 and second AGC section 103 are set to maintain the linearity of a transmission output from the first route passing through the second AGC section 103 and power amplifier 102. That is, as indicated by the characteristic 14 in FIG. 3, the nonlinearity of the gain of the power amplifier 102 is compensated by the gain of the second AGC section 103 as indicated by the characteristic 15 in FIG. 3 to correct the transmission output characteristic so as to obtain linearity as indicated by the characteristic 16 in FIG. 3.

This relationship will be described with reference to FIGS. 4A to 4E. When the transmission output power changes from XdBm to YdBm, the set gain of the power amplifier 102 changes nonlinearly, as shown in FIG. 4A. The gain of the second AGC section 103 is therefore changed in the direction to decrease the set gain of the power amplifier 102, as shown in FIG. 4B. With this operation, the transmission output at the first route passing through the power amplifier 102 and second AGC section 103 changes linearly, as shown FIG. 4C. That is, the nonlinearity of the gain of the power amplifier 102 is corrected by the set gain of the second AGC section 103.

When the desired transmission output at the antenna terminal 100 becomes YdBm, the code generating section 110 outputs a switching signal to the path switches 101 and 104 on the basis of a transmission power code from the CPU 111. With this operation, the path switches 101 and 104 switch the transmission path from the first route to the second route that bypasses the first route. At this time, the gain of the power amplifier 102 cannot be set to a given level or lower as indicated by the characteristic 14 in FIG. 13. By decreasing the gain of the second AGC section 103 therefore, the total gain of the first route passing through the second AGC section 103 and power amplifier 102 is set to 0. That is, as the transmission output Ydbm at the antenna terminal 100, the gain value of the first AGC section 107 is output without any change before and after path switching.

This state will be described further in detail with reference to FIGS. 4A to 4E. To obtain the transmission output power YdBm, as shown in FIG. 4A, the gain of the power amplifier 102 cannot be set to BdB or less. For this reason, as shown in FIG. 4B, the gain of the second AGC section 103 is changed to cancel out the gain BdB of the power amplifier 102 from DdB to EdB, thus performing correction to obtain the linearity of a transmission output from the first route passing through the power amplifier 102 and second AGC section 103, as shown in FIG. 4C.

When the transmission output power at the antenna terminal 100 is YdBm, a gain EdB set in the second AGC section 103 is set to EdB=−BdB so as to set the total gain of the first route passing through the power amplifier 102a and second AGC section 103 to 0 dB.

When, therefore, the transmission output power is YdBm, i.e., path switching is to be performed, the set gain FdBm of the second AGC section 103 appears as the transmission output power (B+E+F=B+(−B)+F=FdBm) shown in FIG. 4E, as shown in FIG. 4D. As a consequence, no discontinuous portion occurs in the transmission output power before and after path switching.

When the first route passing through the power amplifier 102 is to be bypassed, the drain voltage value is set to 0 by the drain voltage control section 108, i.e., the power supply for the power amplifier 102 is turned off. When the transmission output shifts near YdBm, a hysteresis characteristic is set for the transmission output in advance to prevent variations in transmission output in path switching operation.

If the desired transmission output at the antenna terminal 100 falls within the range from the intermediate value to the minimum value, the code generating section 110 generate a control voltage code to the control voltage control section 109 to change the control voltage value of the first AGC section 107. At this time, a switching signal output from the code generating section 110 makes the path switches 101 and 104 maintain the state where the transmission path is switched to the second route that bypasses the first route. With this operation, a desired transmission output can be obtained by only the set gain of the first AGC section 107.

FIG. 4D to 4E show this state. More specifically, when the transmission output power falls within the range from YdBm to ZdBm, the transmission output power shown in FIG. 4E is determined by the set gains FdB to GdB of the first AGC section 107 shown in FIG. 4D. In other words, in the above transmission power range, the set gains FdB to GdB of the first AGC section 107 become transmission output powers.

In the above embodiment, the respective blocks of the transmission power amplification apparatus are independent of each other. However, the driver amplifier 106, path switch 104, and second AGC section 103 may be integrated into a 1-chip LSI (Large Scale Integrated circuit).

As has been described above, according to the present invention, if the transmission output power is high, the variable gain amplifier compensates for the nonlinearity of the nonlinear gain amplifier to obtain the linearity of the transmission power. If the transmission power is low, path switching is performed after the gain of the nonlinear gain amplifier is canceled out by the variable gain amplifier. This can prevent the transmission output power from becoming discontinuous at the time of switching operation. In addition, a reduction in current consumption can be attained by turning off the power supply of the nonlinear gain amplifier after path switching.

In addition, when the nonlinearity of the nonlinear gain amplifier is to be corrected, only the gain of the variable gain amplifier may be controlled in switching the paths for the nonlinear gain amplifier and variable gain amplifier. This makes it possible to simplify the algorithm for transmission power control and hence increase the processing speed.

What is claimed is:

1. A transmission power amplification apparatus comprising:

first variable gain amplification means for amplifying an input signal;

second variable gain amplification means for amplifying an output from said first variable gain amplification means;

nonlinear gain amplification means for nonlinearly amplifying an output from said second variable gain amplification means and outputting a transmission signal; and control means for controlling amplification of the input signal by using the synthetic gain of said first and second variable gain amplification means and said nonlinear gain amplification means in a transmission power range from a maximum value to an intermediate value, and controlling amplification of the input signal by using only the gain of said first variable gain amplification means in a transmission power range from the intermediate value to a minimum value, wherein said second variable gain amplification means has a gain characteristic that corrects nonlinearity of said nonlinear gain amplification means.

2. An apparatus according to claim 1, wherein a total gain of said second variable gain amplification means and said nonlinear gain amplification means is set to substantially 0 at the intermediate value of transmission signal power after correction.

3. An apparatus according to claim 1, wherein said apparatus further comprises switch means for connecting said first variable gain amplification means to a transmission output terminal upon selectively switching between a first route in which said second variable gain amplification means and said nonlinear gain amplification means are connected in series and a second route which bypasses the first route, and said control means controls said first switch means such that an amplified signal from said first variable gain amplification means is output to the transmission output terminal through the first route in the transmission power range from the maximum value to the intermediate value, and an amplified signal from said first variable gain amplification means is output to the transmission output terminal through the second route in the transmission power range from the intermediate value to the minimum value.

4. An apparatus according to claim 1, wherein when the second route is selected by said switch means, supply of power to said second variable gain amplification means and said nonlinear gain amplification means constituting the first route is stopped.

5. An apparatus according to claim 1, wherein said nonlinear gain amplification means comprises a field-effect transistor as an amplification element, and a gain of said field-effect transistor is controlled by controlling a drain voltage.

6. A transmission power amplification method comprising the steps of:

amplifying an input signal by using a first variable gain amplifier;

amplifying an output from the first variable gain amplifier by using a second variable gain amplifier and nonlinear gain amplifier connected in series;

setting a gain characteristic for the second variable gain amplifier to correct nonlinearity of the nonlinear gain amplifier;

amplifying the input signal by using the first and second variable gain amplifiers and the nonlinear gain amplifier in a transmission power range from a maximum value to an intermediate value; and amplifying an input signal upon bypassing the second variable gain amplifier and the nonlinear gain amplifier in a transmission power range from an intermediate value to a minimum value.

7. A method according to claim 6, further comprising the step of setting a total gain of the second variable gain amplifier and the nonlinear gain amplifier to substantially 0 at the intermediate value of transmission power after correction.

8. A method according to claim 6, further comprising the step of controlling a gain of an amplification element by controlling a drain voltage of a field-effect transistor constituting the nonlinear gain amplifier.

9. A method according to claim 6, further comprising the step of stopping supply of power to the second variable gain amplifier and the nonlinear gain amplifier in bypassing operation.

10. A transmission power amplification apparatus comprising:

first variable gain amplifier for amplifying an input signal;

second variable gain amplifier for amplifying an output from said first variable gain amplifier;

nonlinear gain amplifier for nonlinearly amplifying an output from said second variable gain amplifier and outputting a transmission signal; and controller for controlling amplification of the input signal by using the synthetic gain of said first and second variable gain amplifier and said nonlinear gain amplifier in a transmission power range from a maximum value to an intermediate value, and controlling amplification of the input signal by using only the gain of said first variable gain amplifier in a transmission power range from the intermediate value to a minimum value, wherein said second variable gain amplifier has a gain characteristic that corrects nonlinearity of said nonlinear gain amplifier.

* * * * *